United States Patent [19]
Cobaugh et al.

[11] 3,946,477
[45] Mar. 30, 1976

[54] APPARATUS FOR ALIGNING AND INSERTING PINS INTO HOLES OF A SUBSTRATE

[75] Inventors: Robert Franklin Cobaugh, Elizabethtown; James Ray Coller, Mechanicsburg, both of Pa.

[73] Assignee: AMP Incorporated, Harrisburg, Pa.

[22] Filed: June 24, 1975

[21] Appl. No.: 589,814

Related U.S. Application Data

[63] Continuation-in-part of Ser. No. 455,762, March 28, 1974, abandoned.

[52] U.S. Cl. .............................. 29/203 B; 29/203 H
[51] Int. Cl.² .......................................... H05K 3/30
[58] Field of Search ....... 29/203 D, 203 DT, 203 H, 29/203 HT, 203 B, 33 M, 625, 428

[56] References Cited
UNITED STATES PATENTS

| | | | |
|---|---|---|---|
| 3,769,679 | 11/1973 | Kendall | 29/203 B |
| 3,800,416 | 4/1974 | Shultz, Jr. et al. | 29/203 B |

*Primary Examiner*—Carl E. Hall
*Attorney, Agent, or Firm*—William J. Keating; Donald W. Phillion

[57] ABSTRACT

A tool for inserting either single loose pins or a plurality of pins or posts carried upon a mounting strip into holes of a substrate, such as a printed circuit board, in a continuous process and including a push blade and a carrier control blade for receiving the pins and the mounting strip which are carried upon a mounting frame. A plurality of ribs protrude upwardly from the push blade, forming grooves therebetween into which the pins to be aligned for insertion are positioned. A slideable, securing blade, carried upon the mounting frame, is moveable from a position away from the pins to a position engaging the pins to secure them in their aligned positions. A locking mechanism on the securing blade cooperates with the mounting frame to lock the securing blade in the engaging position. Upon insertion of the pins into the holes of the printed circuit board and the exertion of a pressure upon the securing blade, the locking mechanism releases, and a spring moves the securing blade back to its original position away from the pins, thereby enabling the mounting frame to be pushed further forward to cause the pins to be completely inserted into the holes of the printed circuit board.

14 Claims, 5 Drawing Figures

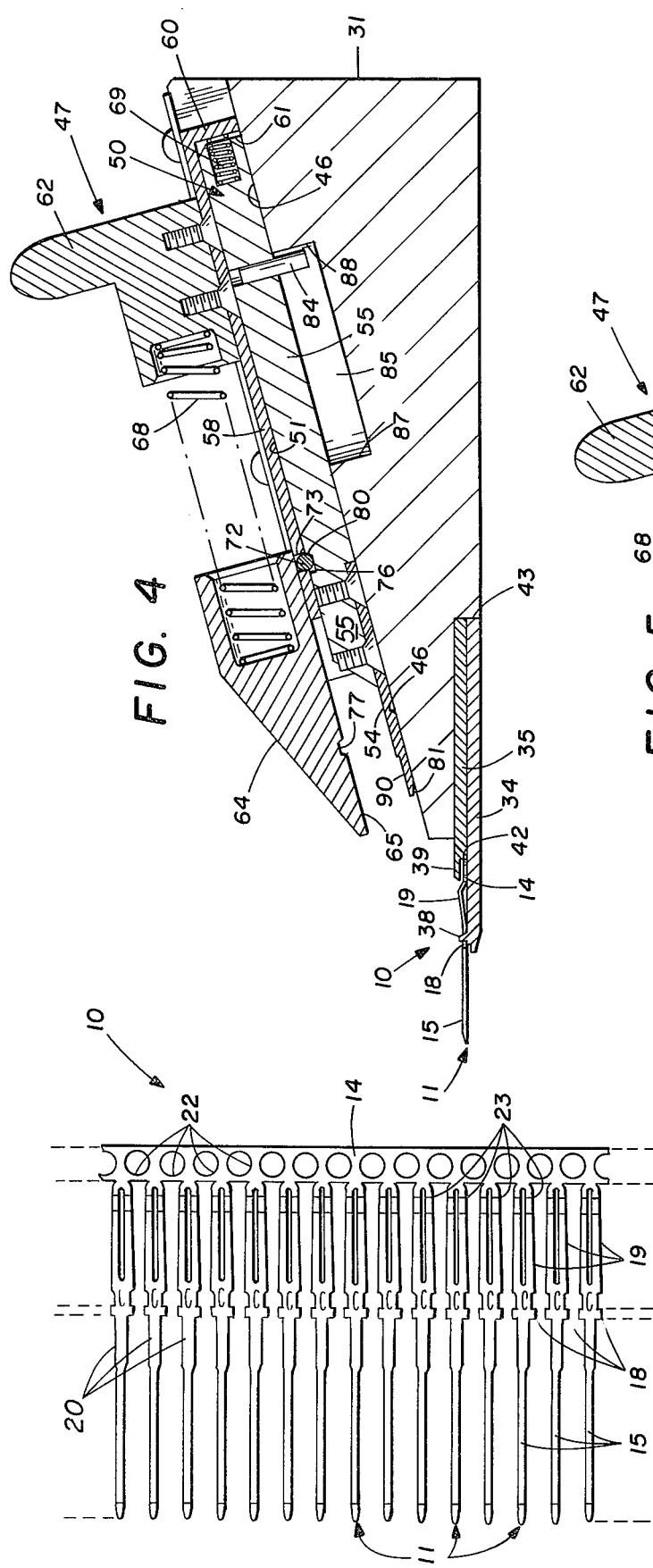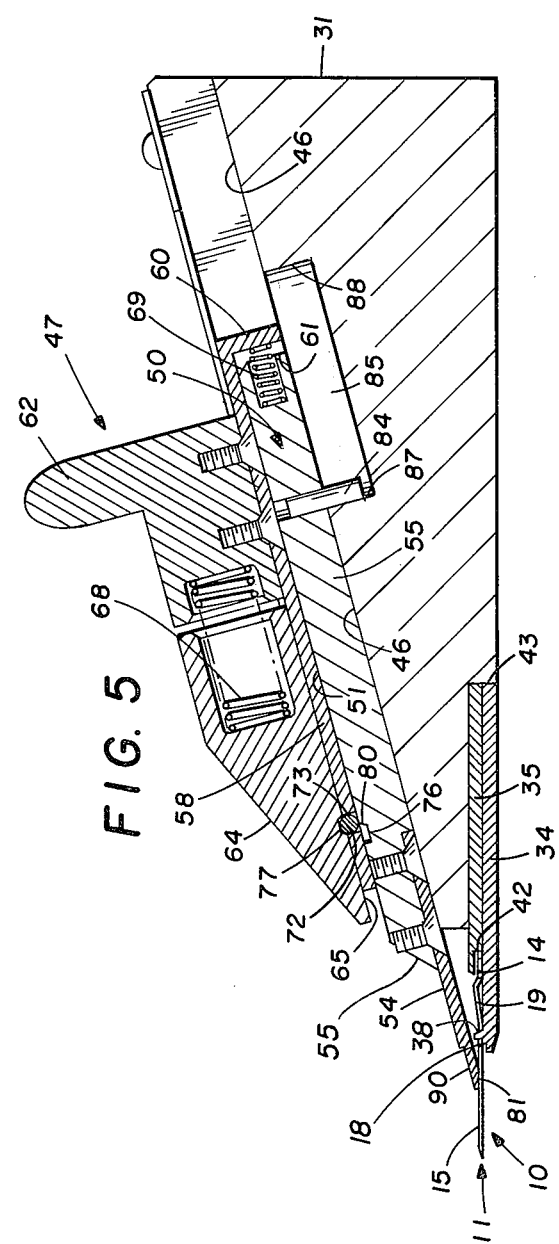

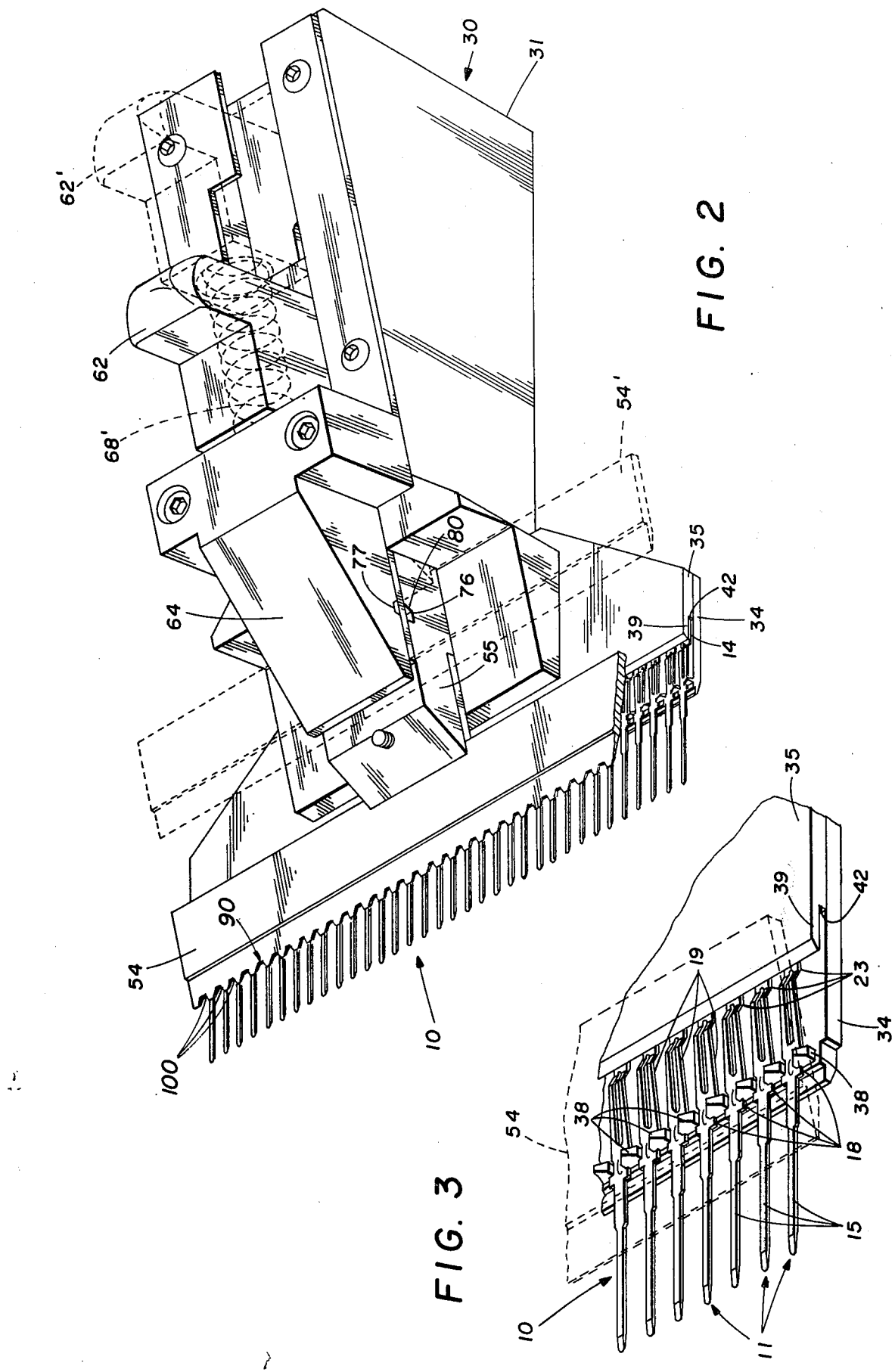

APPARATUS FOR ALIGNING AND INSERTING PINS INTO HOLES OF A SUBSTRATE

CROSS-REFERENCE TO RELATED APPLICATION

This application is a continuation-in-part of application Ser. No. 455,762 filed Mar. 28, 1974, by Robert Franklin Cobaugh and James Ray Coller entitled "Apparatus For Aligning And Inserting Pins Into Holes Of A Substrate" and now abandoned.

BACKGROUND OF THE INVENTION

1. Field of the Invention

This invention relates generally to apparatus for inserting a plurality of pins or posts into holes in a substrate, and more particularly to a single tool or device for providing tip control and insertion capability for mounting pins or posts in holes of a substrate, such as a printed circuit board.

1. Description of the Prior Art

In the formation of printed circuit boards, which are of widespread popularity and usage, conductor leads ordinarily are formed on an insulative substrate by photo etching, or other well known techniques. Usually it is desired to make external attachment to the conductors of the printed circuit board for such purposes as applying power from a power supply or the like or establishing conduction paths between related circuit boards and other electrical circuitry.

One way in which attachment to the conductors of the printed circuit boards is achieved is by providing a plurality of pins or posts which are outstanding from the printed circuit board and to which connection can be made by soldering connection, or by suitable mating plugs or by other well known techniques. The positions of such posts or pins on the board are determined by the circuit paths printed on the board. Such circuit paths are often designed so that the posts are positioned in a straight line on the board and spaced apart equal distances. Holes are provided through the printed circuit board substrate to receive the pins, and are usually plated through with the printed circuit board conductor material to enhance the final electrical connection between the pins and the associated printed circuit board conductive path.

In the insertion of the pins or posts into the holes of the printed circuit board substrate, several techniques are typically used. Quite often the pins are individually hand inserted into the printed circuit board. Also, machines have been employed for automatic insertion of the pins, one by one, into the holes of the printed circuit board. In either process, a considerable amount of time is involved in completing the insertion process prior to subsequent completion steps such as wave soldering or other well known methods.

To expedite the insertion processes, a pin "comb" arrangement has been developed in which a plurality of side-by-side pins are carried on a common, continuous mounting strip. Typically, such pin combs are stamped or machined from a single piece of conductive material, such as copper, or the like and physically resemble a common hair comb. Also, such pin combs are often of relatively thin thickness, being on the order, for example, of 1/32 of an inch or less. This causes handling difficulties in inserting the pins, especially when the mounting strip extends over a length of several inches, since the pins tend to have a considerable degree of flexibility upon the mounting strip.

In the past, two individual tools have been used in sequence in the insertion of the pins of such pin comb into the board. First, a combining tool is employed to straighten and align the pins and hold them for partial insertion into the holes of the printed circuit board substrate. The combing tool is then removed and a push blade and a carrier control blade assembly is applied to complete the insertion. The combing tools commonly used are configured much like a pair of pliers having elongated U-shaped jaws. The U-shaped jaws are much like an elongated pair of tweezers having serrations formed on their inner surfaces to surround and grip the pins or posts, thereby straightening them upon the carrier and positioning them along the desired center line axis of the holes into which they are to be inserted.

After the combing tool has been removed, the plush blade and carrier control blade assembly is applied, as indicated. The push blade is simply an elongated member which is located adjacent the pins and their carrier. The carrier control blade is attached to the push blade, and is offset from the push blade to form a channel to receive the pin carrier or mounting strip. Thus, pressure can be applied to the push blade and carrier control blade to complete the insertion of the already partially inserted pins into the printed circuit board.

Because the prior art push blade and carrier control blade assembly is intended merely to engage the pin carrier strip, it affords control for the center line alignment and the tip straightening functions necessary for gang insertion of the pins, which functions are subsequently performed by a separate combing tool. Thus, in the prior art, two separate tools each requiring individual manipulation are required to achieve the desired gang insertion of the pin assembly and carrier into the printed circuit board.

It can be seen that this prior art two step assembly operation requires time for interchange of the tools, or at least additional personnel to efficiently effect gang insertion of the posts.

BRIEF STATEMENT OF THE INVENTION

In light of the above, it is, therefore, a primary object of the invention to provide an apparatus for inserting the pins of a pin assembly or comb into holes of a substrate.

It is another object of the invention to present a single tool for providing alignment and tip control for gang insertion of pins or posts into a printed circuit board.

It is another object of the invention to provide a single tool or device for inserting a plurality of pins into holes of a printed circuit board substrate which tool is capable of automatic machine implementation.

It is still another purpose of the invention to provide a device for inserting pins of a pin comb into holes of a printed circuit board, which device has a latch mechanism that prealigns the pins before insertion, and releases the latch mechanism during the insertion to facilitate the insertion of the entire pin assembly in a single continuous pushing operation.

The invention, in its broad aspect, provides a tool for inserting a plurality of pins carried upon a mounting strip into holes of a printed circuit board. The tool includes a frame and a channel attached to the frame for receiving the mounting strip. A first plate is located adjacent the channel to support the pins, and a second, flat plate is slideably carried upon the frame, and moveable between positions away from and engaging the pins to secure the pins between the first and second plates in the engaging position. The second plate is lockable in the engaging position. A plurality of upstanding ridges or ribs are provided on the first plate to separate and align the pins, which alignment is maintained by the second plate in the engaging position. Upon insertion of the pins into the holes of the printed circuit board, after the initial insertion, the substrate or board presents a resisting force upon the second flat plate, overcoming the locking means. A spring then returns the second plate to the unlocked position, and the insertion force is uninterruptedly continued to complete the insertion of the pin comb assembly into the printed circuit board holes provided therefor. In a modified form of the invention the first and second plates hold a single loose pin for insertion thereof in a hole of a substrate or a printed circuit board.

BRIEF DESCRIPTION OF THE DRAWINGS

The above-mentioned and other objects, and features of the invention will become more apparent to those skilled in the art from the following description thereof when read in conjunction with the accompanying drawings in which:

FIG. 1 is a plan view of a pin comb for use with the insertion apparatus of FIGS. 2–5;

FIG. 2 is a perspective view of the apparatus, in accordance with the invention, for inserting the pins of FIG. 1 into holes of a printed circuit board, in a locked position, showing an unlocked position by broken lines;

FIG. 3 is an enlarged perspective view of a portion of the apparatus of FIG. 2 illustrating the pin comb of FIG. 1 in inserted position, locked within the apparatus;

FIG. 4 is a side elevation, cut-away of the apparatus of FIG. 2, but with the pin comb in inserted, but unlocked position;

FIG. 5 is a side elevation, in cross-section, of the apparatus of FIG. 3, showing the pin comb inserted and in locked position.

In the various figures of the drawing, like reference numerals are used to denote like parts. It should also be noted that the relative sizes and dimensions of various parts have been exaggerated or enlarged for clarity of illustration and ease of description.

DETAILED DESCRIPTION OF THE PREFERRED EMBODIMENTS

The general purpose of the invention, as indicated above, is to insert a "comb" of conductor pins into corresponding holes of a printed circuit board, with a single device which receives and holds, the comb, automatically aligns the pins of the comb, for insertion, and provides a means for completing the insertion. The structure of a typical assembly of a comb of pins insertable by the tool of the invention is shown in FIG. 1, and is denoted generally by the reference numeral 10. Such typical comb 10 is fabricated from a single piece of flat conductor material, such as copper, gold plated steel, or the like, stamped, cut, or machined into the configuration shown. A number of pins 11 are outstanding from a carrier strip 14, which can be broken away from the pins 11 after insertion. Each of the pins 11 has an elongated portion or post 15 which is inserted into a preformed hole in a substrate, such as a printed circuit board (not shown). A shoulder or tab 18 is located on the elongated portion 15 and comes to rest on the printed circuit board surface when the contact is fully inserted in the printed circuit board. The widened portion 20 of the contacts fits within the receiving aperture in the printed circuit board. A contact portion is connected to the carrier or mounting strip 14. The contact portion 19 remains after the carrier strip is removed.

Commonly, holes 22 are formed in the carrier strip 14 during the stamping or fabrication process, and are used principally for conveying the pin assembly 10 from point to point in the construction process. The holes in the carrier strip 14, as will become apparent below, can additionally be employed in conjunction with automatic machines for facilitating the insertion of the pin comb 10 into the tool of the invention.

Also, to enable the carrier strip 14 to be removed from the pins 11, a score or groove (not shown), on the underside of the comb 10 at the location indicated by the reference numeral 23, is formed upon the divided portion of the pins 11. Thus, after insertion of the pins into the substrate, a transverse or bending force can be applied to the carrier strip 14 to break it away from the pins 11.

The device or apparatus in accordance with the invention, generally denoted by the reference numeral 30, for inserting the pin comb 10 of FIG. 1, is shown in FIGS. 2–5. The apparatus 30 is preferably fabricated upon a base 31 of generally triangular configuration. A pin comb push blade 34 and a carrier control blade 35 are mounted to the front end of the base 31. The push blade 34 has a serrated edge comprising a plurality of pyramidal shaped ribs or protrusions 38 upstanding at its forward end, which function to be interleaved upwardly in between the pin portions 15 of the individual pins 11 of the comb assembly 10, as shown in FIGS. 3, 4, and 5. The carrier control blade 35 is located above the push blade 34, and has an overhanging lip or edge 39 forming a groove or channel 42 between the push blade 34 and the lip 39. Thus, the carrier strip 14 of the pin assembly 10 is locatable within the channel 42, with the tab portions 18 of the pins 15 adjacent and in front of the interfitting protrusions 38 on the push blade 34, to engage the pin assembly 10 in the direction of the subsequently to be applied insertion force.

In the embodiment illustrated, the push blade 34 and carrier control blade 35 are shown located within a groove or channel 43 in the lower front portion of the base 31, attached thereto by screws or the like (not shown), although it will be appreciated that the base 31 and push and carrier control blades, 34 and 35, could be made from a single piece, of material.

A locking or securing blade assembly 50 is located on the top surface 46 of the base 31 and is operated by the overriding handle assembly 47, as described below in detail. The securing blade assembly 50 is of generally T shaped configuration, with a comb control bar 54 of a width approximately equal to that of the push blade 34, and forming the top and a rearwardly extending bearing portion 55 forming the base or leg of the "T". The handle assembly 47 includes an L-shaped bearing base which rides with a portion 58 upon the top surface 51 of the bearing 55 of the securing blade assembly 50, and with another portion 60 extending downwardly behind the end 61 of the bearing 55. A hand or machine operable upstanding handle 62 is attached to the L-shaped bearing base adjacent the overhanging portion 60. An overhang 64 is attached to, or formed as a part of, the base 31, to provide a bearing surface 65 above a complementary bearing surface 46 on top of the base 31 between which the handle assembly 47 and securing blade assembly 50 are slideably moveable.

A spring 68 is located between the overhang 64 and the handle 62 to normally bias the handle assembly 47 to the rearward or unlocked position, as shown in FIGS. 2 and 4. Likewise, a spring 69 is located between the back portion 61 of the bearing 55 and the downwardly extending portion 60 of the L-shaped bearing base to normally urge the base 60 away from the back 61 of the securing blade assembly 50.

A detent pin 72 is located within a hole or slot 73 in the base of the handle assembly 47, as shown in FIGS. 4 and 5, and is of sufficient size to fit into the hole 73 and a channel 76 in the bearing 55, to lock the handle assembly 47 and securing blade assembly 50 together. Thus, movement of the handle assembly 47 forward or back will cause corresponding movement of the securing blade assembly 50. When the handle assembly 47 and securing blade assembly 50 are moved to the forward position, shown in FIGS. 2 and 5, however, the detent pin 72 is caused to be moved upwardly in the slot 73 and into the channel 77 in the bearing surface 65 of overhang 64. This upward movement is assured by a ramp 80 across the bottom corner of the channel 76 in the bearing 55 of the securing blade assembly 50. The securing blade assembly 50 is then freed from the handle assembly 47 and is moved by the biased spring 69 to a position beyond the slot 73 in the handle assembly 47 and the channel 77 in the overhang 64. Thus, the detent pin 72 is located above the top surface 51 of the securing blade assembly 50 to co-exist within the groove 73 of the handle 47 and the groove 77 in the overhang 64, to lock them together. In this position, therefore, the handle assembly 47 cannot be moved rearwardly. Also in this position, the tip 90 of the comb control bar 54 engages the pins 15 of the pin assembly 10. The edge 81 of comb control bar 90 has grooves 100 (FIG. 2) thereon to fit over the individual posts 15 (FIG. 3) and assist in aligning and supporting said posts.

To limit the forward and rearward travel of the securing blade assembly 50, a pin 84 is provided in the bearing 55 of the securing blade assembly 50. The pin 84 rides within a channel 85 within the base 31 to engage a forward end wall 87 in the pin engaging or locked position, as shown in FIG. 5, and engaging the rearward wall 88 in the unlocked position shown in FIG. 4.

It can be seen that when the handle assembly 47 and securing blade assembly 50 are in the forward, or locked position, as shown in FIG. 5, and a force is applied to the serrated tip 90 of the comb control bar 54, thereby overcoming the bias of the spring 69, the securing blade assembly 50 will be moved back with respect to the handle assembly 47, bringing the channel 76 of the bearing 55 in alignment with the hole 73 in handle assembly 47 and with the channel 77 in the overhang 64. The detent pin 72 will then fall downwardly into the hole 73 and the channel 76 to release the handle assembly 47 and securing blade assembly 50, which are then both moved to the rear or unlocked position of FIG. 4, by the action of the spring 68.

In the operation of the apparatus 30, the "comb" of pins to be inserted into a printed circuit board can be manually or automatically inserted into the push blade 34 and carrier control blade 35 of the apparatus 30. The carrier strip 14 fits into the groove 42 and the pyramidally shaped protrusions 38 act to separate the pins 15 and generally align them along the desired center lines for insertion into the holes of a printed circuit board (not shown). The handle assembly 47 and securing blade assembly 50 are then moved to the locked position shown in FIGS. 2 and 5, bringing the comb control bar 54 into contact with the pins 15, thereby securing the comb assembly 10 in the apparatus 30 with the pins properly aligned.

In the locked position, the detent pin 72 is moved by the forward action of the handle assembly 47 to be located within the hole 73 of the handle assembly 47 and the channel 77 in the overhang 64. In the locked position, also the spring 68 is in compression between the overhang 64 and handle 62. The pins 15 are then directly inserted into the holes of the printed circuit board. As the insertion continues, the printed circuit board comes to bear upon the tip 90 of the comb control bar 54. The securing blade assembly 50 is then urged by the pressure of the printed circuit board, or another row of already inserted comb product, upon the tip 90 against the bias of the spring 69, and the detent pin 72 falls back into the hole 73 and channel 76. The handle assembly 47 and the securing blade assembly 50 are then moved back to the unlocked position by the decompressing action of the spring 68, shown by the broken lines in FIG. 2 (the parts being denoted by a prime after their reference number).

The insertion force upon the partially inserted pin comb assembly 10 is then uninterruptedly continued by the following means. Since the shouldered portions 18 of the individual pins 15 bear upon the pyramidal protrusions 38 the forward insertion force is effectively applied to the pins 11. This forward insertion force is continued until the shouldered portions 18 come to rest upon the surface of the printed circuit board. The entire apparatus 30 is then simply removed from the pin comb 10, and the process is then completed.

The parts of the apparatus 30, in accordance with the principles of the invention, can be of any suitable material, such as rugged plastic, metal, or the like, the particular material chosen being determined principally by the application to which the apparatus is to be used. It has been found, for example, that steel or like material can be particularly advantageously employed.

It will also be appreciated that although the invention has been shown fabricated from a number of plates or parts, such as individual push blade 34 and carrier control blade 35, the tip or top 54 of the securing blade 50 with its base 55, and so forth, that the particular parts can be fabricated from a single unit. For example, the base 31, push blade 34, and carrier control blade 35, can conveniently be fabricated from a single piece of material, as can the entire securing blade assembly 50, the particular embodiment shown being merely by way of example of a typically fabricated apparatus.

It will also be appreciated by those skilled in the art that the apparatus, as above described, in accordance with the invention, can be readily employed with automatic machinery, such as digitally numerically controlled machines, with, for example, pneumatic or other type force applied to the base 31 to drive the posts 11 into the board. This is possible by virtue of the fact that the pins are automatically aligned upon insertion of the pin assembly 10 into the apparatus 30 and are locked and held in the aligned position by the comb control bar 54 until after the insertion process is started. Once the insertion process has begun, the comb control bar 54 is automatically returned to the unlocked position to enable the same apparatus to continue to be employed to complete the insertion process until the shoulders 18 of the individual pins 11 are in the desired final position adjacent to the printed circuit board.

If desired, the invention can be adapted to insert single pins into holes in a substrate or a circuit board. More specifically, in FIGS. 2 and 3 control blade 35 and push blade 34 is contructed to retain only a single pin rather than the comb of pins shown in FIGS. 2 and 4. This single pin can be inserted by an operator into a single hole in a printed circuit board or it can be utilized with automated machinery to apply single pins at predetermined holes in a predetermined sequence in a printed circuit board.

Although the invention has been described and illustrated with a certain degree of particularlity, it is understood that the present disclosure has been made by way of example and that numerous changes in the details of construction and the combination and arrangement of parts may be resorted to without departing from the spirit and scope of the invention as hereinafter claimed.

WE CLAIM:

1. Apparatus for inserting pins of a pin assembly into holes in a substrate comprising:
   a pin assembly receiving member for engaging the pin assembly to transmit an insertion force thereto, and having a flat portion to underlie a portion of the pin assembly and constructed to support and align the pins;
   a securing member having a surface adapted to contact and overlie a portion of the pin assembly to hold the pin assembly against said flat portion;
   a base securely carrying said flat portion, and further carrying said securing member moveably between a position contacting said pin assembly and a position away from said pin assembly; and
   means coacting between said base and said securing member for locking said securing member in said contacting position, and for releasing said securing member upon insertion of a predetermined length of the pins into the holes in the substrate.

2. The apparatus of claim 1 further comprising a plurality of pin alignment elements interfitting the pins on said flat surface of said pin assembly receiving member.

3. Apparatus for inserting pins of a pin assembly into holes in a substrate comprising:
   a pin assembly receiving member for engaging the pin assembly to transmit an insertion force thereto, and having a flat portion to underlie a portion of the pin assembly and constructed to support and align the pins;
   a securing member having a surface adapted to contact and overlie a portion of the pin assembly to hold the pin assembly against said flat portion;
   a base securely carrying said flat portion, and further carrying said securing member moveably between a position contacting said pin assembly and a position away from said assembly; and
   means coacting between said base and said securing member for locking said securing member in said contacting position, and for releasing said securing member upon application of a predetermined force upon said securing member in a direction opposite the insertion force.

4. The apparatus of claim 3 further comprising a plurality of pin alignment elements interfitting the pins on said flat surface of said pin assembly receiving member.

5. Apparatus for inserting pins of a pin assembly into holes in a substrate comprising:
   a pin assembly receiving member for engaging the pin assembly to transmit an insertion force thereto, and having a flat portion to underlie a portion of the pin assembly and constructed to support and align the pins;
   a securing member having a surface adapted to contact and overlie a portion of the pin assembly to hold the pin assembly against said flat portion; and
   a base securely carrying said flat portion, and further carrying said securing member moveably between a position contacting said pin assembly and a position away from said pin assembly;
   said securring member comprising:
      an elongated bearing slidably mounted upon said base;
      a handle overriding at least a part of the motion of said bearing;
      an overhang on said base beneath which said handle and said bearing are free to slide;
      said bearing and said overhang each having a channel therein and said handle having a slot therethrough adapted to receive a locking pin;
      a locking pin normally positioned simultaneously within said handle slot and said bearing channel in the unlocked position of said securing member to secure said elongated bearing to said handle;
      said handle, said elongated bearing and said securing locking pin being moveable forward to align said locking pin with said slot in said overhang channel;
      means for causing said locking pin to move out of said handle slot and to become positioned simultaneously within said overhang channel and handle slot in said locked position of said securing member; and
      biasing means between said handle and said bearing acting to locate the bearing channel away from said slot in said locked position whereby when a force is applied to overcome said bias means and again align said bearing channel with said handle slot, said pin moves to become positioned simultaneously in said handle slot and said bearing channel.

6. The apparatus of claim 5 further comprising a plurality of pin alignment elements interfitting the pins of said flat surface of said pin assembly receiving member.

7. The apparatus of claim 5 further comprising second bias means between said handle and said overhang to normally urge said securing member to the unlocked position.

8. Apparatus for receiving an assembly of side-by-side pins for insertion into holes of the substrate comprising:
   a block;
   a first flat member carried on said block for receiving said assembly;
   a plurality of protrusions on said first member for extending between, separating, and aligning the pins, and for transmitting an insertion force thereto;
   a second flat member carried by said block and slidable in a first direction from an unlocked position away from said pins to a locked position contacting said pins, to thereby secure said assembly of pins against said first flat member;

bias means for urging said second flat member in a second direction away from said contacting position, and means for constraining said second member in said locked contacting position until a predetermined force in said second direction is applied, whereupon said bias means moves said second member to said unlocked position.

9. The apparatus of claim 8 wherein said constraining means comprises a detent pin selectively moveable to a position co-existent within a channel in said second flat member and a channel in said block.

10. The apparatus of claim 9 further comprising a handle overriding said second flat member for controlling its position, and having a slot therethrough for receiving said detent pin, and wherein said channel in said block is located in an overhanging portion thereof whereby said detent pin is moveable to a position co-existent within said channel in said second flat member and said slot in said handle.

11. A tool for inserting a plurality of pins carried upon a mounting strip into holes of a printed circuit board, comprising:

a triangular block;

a first plate attached to extend from one side of said block;

a second plate carried by said first plate, having a groove along its length to form a mounting strip receiving channel between said first and second plates;

a plurality of upstanding protrusions upon said first plate for aligning said pins;

a T-shaped member slideably mounted on said block on a side adjacent said one side, to be moveable to a first position to engage said pins and to a second position to disengage from said pins;

said member clamping said pins in said first position between said first plate and T-shaped member;

a post attached to said T-shaped member extending into a slot in said block to limit the sliding travel of said T-shaped member;

a handle slideably overriding a portion of said T-shaped member, and having a hole therein;

a first spring between said handle and said T-shaped member to urge said handle away from said T-shaped member in a direction away from said first plate;

an overhang upon said block under which said handle and said T-shaped member slide;

a second spring between said overhang and said handle to urge said handle away from the direction of said first plate;

and a pin located in said handle between said overhang and said T-shaped member, moveable between a first position within the hole in said handle and a channel in the T-shaped member and a second position within the channel within the overhang and the hole in said handle, the overhang channel being located whereby when the pin is located in the handle hole and the overhang channel, the T-shaped member is in said engagement position and the T-shaped member channel is being maintained by said first spring in a position off-set from said handle towards said first plate, and whereby when a force is applied to said T-shaped member to overcome the bias of said first spring, said T-shaped member channel becomes located beneath the hole of the handle to receive the pin, thereby allowing the second spring to move the T-shaped member and handle to the said away position.

12. The tool of claim 11 further comprising a ramp within the channel of the T-shaped member to move said pin to the position within the overhang channel when the handle hole, the channel of the T-shaped member, and the overhang channel are aligned, and the T-shaped member is moved with respect to the handle by said first spring.

13. The apparatus of claim 12 wherein said pins each comprise a shoulder intermediate its end and said carrier strip, and wherein said protrusions engage said shoulders to facilitate application of insertion force thereupon.

14. Apparatus for inserting a pin into a hole in a substrate and comprising:

a pin receiving member for engaging said pin to transmit an insertion force thereto, and having a first flat member to underlie a portion of said pin and constructed to support and align said pin;

a second flat member slidably mounted on said pin receiving member and slidable in a first direction from an unlocked position away from said pin to a locked position contacting said pin to secure said pin against said first flat member;

bias means for urging said second flat member in a second direction away from said locked position towards said unlocked position; and means for constraining said second flat member in said locked position until a predetermined force in said second direction is applied, whereupon said bias means moves said second flat member to said unlocked position.

* * * * *